United States Patent
Sandell et al.

(10) Patent No.: US 10,659,084 B1
(45) Date of Patent: May 19, 2020

(54) SOFT DECODING FOR FLASH MEMORY

(71) Applicants: Kabushiki Kaisha Toshiba, Minato-ku (JP); Toshiba Memory Corporation, Minato-ku (JP)

(72) Inventors: Magnus Stig Torsten Sandell, Bristol (GB); Amr Ismail, Bristol (GB)

(73) Assignees: Kabushiki Kaisha Toshiba, Minato-ku (JP); Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 16/205,924

(22) Filed: Nov. 30, 2018

(51) Int. Cl.
 *H03M 13/00* (2006.01)
 *H03M 13/45* (2006.01)
 *G06F 11/10* (2006.01)

(52) U.S. Cl.
 CPC ......... *H03M 13/45* (2013.01); *G06F 11/1004* (2013.01)

(58) Field of Classification Search
 None
 See application file for complete search history.

(56) References Cited

U.S. PATENT DOCUMENTS

| | | | |
|---|---|---|---|
| 10,395,754 B2 * | 8/2019 | Maffeis | G11C 11/5642 |
| 2004/0128592 A1 * | 7/2004 | Park | H03M 13/45 |
| | | | 714/709 |
| 2015/0227403 A1 * | 8/2015 | Zhang | G06F 11/1008 |
| | | | 714/704 |
| 2015/0242268 A1 | 8/2015 | Wu et al. | |
| 2015/0243363 A1 * | 8/2015 | Wu | G11C 11/5642 |
| | | | 365/185.18 |
| 2016/0006462 A1 * | 1/2016 | Hanham | H03M 13/3715 |
| | | | 714/764 |
| 2016/0210190 A1 * | 7/2016 | Ha | G06F 11/1068 |
| 2016/0277041 A1 | 9/2016 | Zhang et al. | |
| 2018/0012663 A1 * | 1/2018 | Alhussien | G11C 29/52 |

OTHER PUBLICATIONS

Sharon, E. et al., "Dynamic Memory Error Model Estimation for Read and ECC Adaptations", Western Digital, Non-Volatile Memory Workshop, Mar. 2017, 2 pages.

* cited by examiner

*Primary Examiner* — Mujtaba M Chaudry
(74) *Attorney, Agent, or Firm* — Oblon, McClelland, Maier & Neustadt, L.L.P.

(57) ABSTRACT

A method of soft decoding received signals. The method comprises defining quantisation intervals for a signal value range, determining a number of bits detected in each quantisation interval, a number of bits in each quantisation interval that are connected to unsatisfied constraints and a probability that the error correction code is unsatisfied, determining an overall bit error rate based on the probability that the error correction code is unsatisfied, determining a log likelihood ratio for each quantisation interval based on the overall bit error rate, the number of bits detected in each quantisation interval and the number of bits in each quantisation interval that are connected to unsatisfied constraints and performing soft decoding using the log likelihood ratios.

17 Claims, 7 Drawing Sheets

SOFT DECODING FOR FLASH MEMORY

FIELD

Embodiments described herein relate generally to reading received signal values and in particular to a method of soft decoding received signal values.

BACKGROUND

Error-correcting codes (ECC) are often used in communications and storage applications to protect the data against detection/reading errors. Although there are many types of ECC, most of them work better if, as part of their decoding an indication of the level of reliability of the decoding is provided instead of simply a binary decoding decision. In some case, it is possible to compute an indication of decoding reliability based on the system model. However in other cases, the system model is too complicated to allow such computation being performed at all or at least in an efficient manner.

In the following, embodiments will be described with reference to the drawings in which.

DETAILED DESCRIPTION

Figure 1:
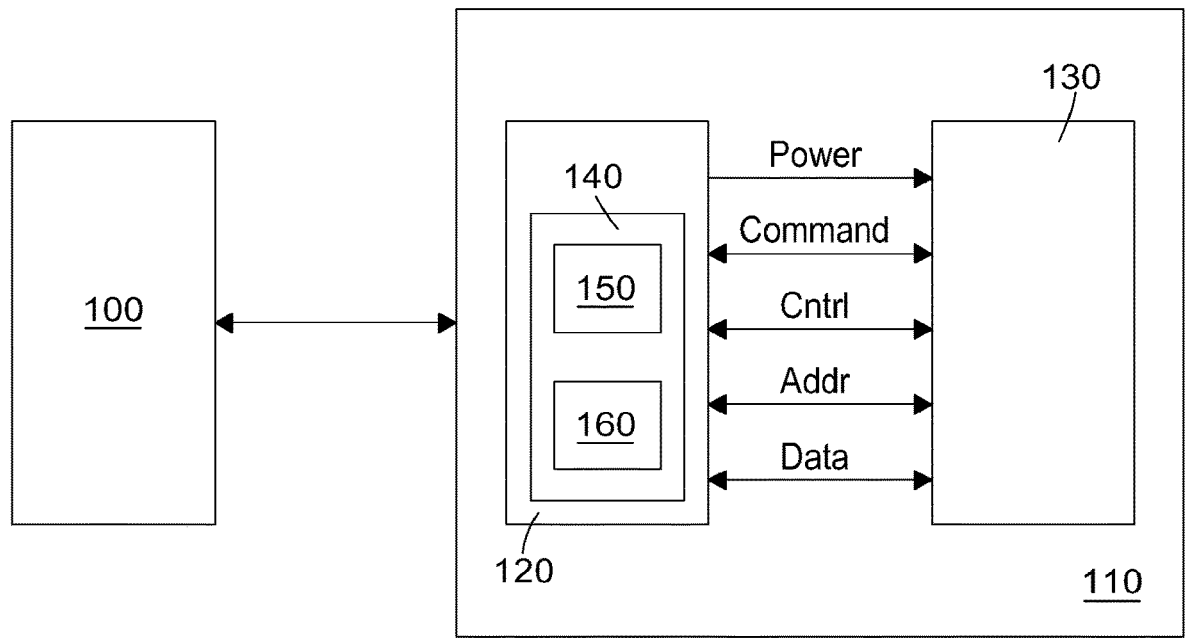
FIG. 1 shows a system that comprises a computing device and a non-volatile flash storage memory.

According to an embodiment there is provided a method of soft decoding received signals. The method comprises defining quantisation intervals for a signal value range, determining a number of bits detected in each quantisation interval, a number of bits in each quantisation interval that are connected to unsatisfied constraints and a probability that the error correction code is unsatisfied, determining an overall bit error rate based on the probability that the error correction code is unsatisfied, determining a log likelihood ratio for each quantisation interval based on the overall bit error rate, the number of bits detected in each quantisation interval and the number of bits in each quantisation interval that are connected to unsatisfied constraints and performing soft decoding using the log likelihood ratios.

The signal value range may be a threshold voltage range if the received signals are data read from a memory, for example from flash memory. If the signal is received via a transmission channel the signal value range is the range of signal values that can be received using the modulation scheme of the wireless transmission.

The method may further comprise determining an error in each quantisation interval based on the overall bit error rate and the number of bits in each quantisation interval that are connected to unsatisfied constraints and thereafter determining said log likelihood ratio further using said overall bit error rate.

The method further comprises determining one or more or all of a probability that a constraint is unsatisfied when an associated bit is correct based on said overall bit error rate and a constraint degree of the error correction code, a probability that a constraint is unsatisfied when an associated bit is incorrect based on said overall bit error rate and a constraint degree of the error correction code, a probability that a correct bit is connected to a predetermined number of unsatisfied constraints based on a variable degree of the error correction code, the number of unsatisfied constraints and a probability that a constraint is unsatisfied when an associated bit is correct and a probability that an incorrect bit is connected to a number of unsatisfied constraints based on a variable degree of the error correction code, the number of unsatisfied constraints and a probability that a constraint is unsatisfied when an associated bit is incorrect.

The method further comprises setting said log likelihood ratio to a predetermined value for a or any quantisation interval in which one or more of the number of bits detected is zero or in which an error is determined to be lower or equal to zero.

Said data may be stored using a multicell write once storage technique, wherein said log likelihood ratios are determined for an array, wherein the quantisation intervals for the individual cells used in combination in the multicell write once storage technique individually define dimensions of the array.

The method may further comprise a step of attempting to hard decode said data by repeatedly reading memory cells storing said data with a changing read threshold parameter, said quantisation intervals being defined by said change in the read threshold parameter.

The method may further comprise outputting the soft decoded data from a controller that has performed said soft decoding to an output port or to a connected device.

According to an embodiment there is provided a non-transitory storage medium storing computer program instructions for execution by a processor and that, when executed by a processor, cause the processor to perform any of the above discussed methods.

According to another embodiment there is provided a device for soft decoding received signals comprising a processor and memory storing instructions for execution by the processor. The instruction causing the processor, when executing the instruction to define quantisation intervals for a signal value range, determine a number of bits detected in each quantisation interval, a number of bits in each quantisation interval that are connected to unsatisfied constraints and a probability that the error correction code is unsatisfied, determine an overall bit error rate based on the probability that the error correction code is unsatisfied, determine a log likelihood ratio for each quantisation interval based on the overall bit error rate, the number of bits detected in each quantisation interval and the number of bits in each quantisation interval that are connected to unsatisfied constraints and perform soft decoding using the log likelihood ratios.

The device may be is a flash memory storage device comprising a flash memory controller and a flash memory array. The device may comprise an input/output port for receiving data to be stored in the flash array and/or for outputting decoded data.

The device may be a wireless communications device and may comprise an antenna for receiving the signals and/or an output port for outputting the soft decoded signals to other devices, for example through a wired connection.

The disclosed method provides a way of computing the reliability (also referred to as soft values) of estimated bits in a low-complexity manner. In embodiments the number of unsatisfied constraints of an LDPC code are counted. It is further determined how many bits fall within which quantisation interval. Based on this information the number of bit errors in each quantisation interval are estimated and, on the basis of this estimation, conclusions are drawn on the reliability of an estimated bit.

The method of the embodiment is general and can be used in any application in which the distributions of received signal values overlap so that reliable discrimination between signals is no longer possible. Embodiments presented herein refer to the decoding of information stored in flash memory. In other embodiments information stored in other memory types may be decoded. Embodiments also relate to decoding of signals received in wireless communication systems, as is described with reference to FIG. 9.

FIG. 1 shows a system that comprises a computing device 100 and non-volatile flash storage memory 110. The computing device may be a mobile computing device, such as a mobile phone, tablet computer, laptop, camera or any other type of mobile computing device. Alternatively the computing device 100 may be stationary, such as a desktop computer or indeed part of a stationary server or part of a storage bank, such as part of a RAID solution.

The non-volatile flash storage memory 110 may take any form of non-volatile storage device comprising flash memory. The non-volatile flash storage memory 110 may, for example, be a "thumb drive", a solid-state drive (SSD), a memory card, etc.

The computing device 100 and the non-volatile flash storage memory 110 are in communicative connection with each other in a manner that allows the computing device 100 to transmit data and commands indicating the processing the data is to be subjected to by the non-volatile flash storage memory 110 to the non-volatile flash storage memory 110 and that allows the non-volatile flash storage memory 110 return data retrieved from memory to the computing device 100. The computing device 100 may also provide power to the non-volatile flash storage memory 110. A number of interfaces that allow communication between a computing device 100 and a non-volatile flash storage memory 110 are known. The exact nature of the interface is not important. Exemplary interfaces include the USB interface, SD, microSD, xD, Compactflash, MMC, to name but a few.

The non-volatile flash storage memory 110 comprises a memory controller 120 and non-volatile flash memory 130. The memory controller 120 interfaces with the computing device 100 as well as with the flash memory 130. The memory controller 120 provides power to the flash memory 130 and is moreover connected to the flash memory 130 via command, control, address and data lines. The memory controller 120 may control all of the operations flash memory 130.

Figure 2:
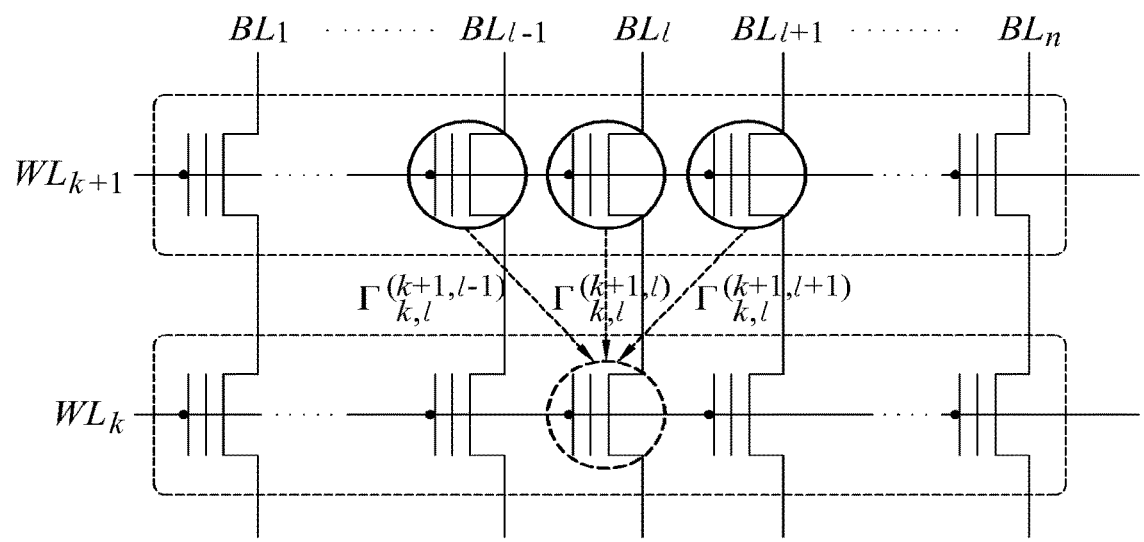
FIG. 2 shows an architecture of memory cells within a flash array.

As shown in FIG. 2, memory cells in NAND flash memory consist of field effect transistors that comprise a floating gate interposed between the FET's gate and channel. NAND flash memory cells are organised into multiple blocks. Memory cells within each block are arranged horizontally along word-lines (for example around 32-64 word lines per block; in FIG. 2 two word lines, $WL_{k+1}$ and $WL_k$ are shown) that connect the gates of horizontally adjacent FETs, and vertically along (often thousands of) bit-lines ($BL_1$ to $BL_n$ in FIG. 2), connecting drains and sources of vertically adjacent FETs. The control gates of all the cells along a word-line are connected to the address bus while the drains of the cells along a bit-line are connected to the data bus. The unit for read/write operations is the word-line, whereas erasure is applied block-wise.

To determine the storage state of a memory cell a bias voltage is applied to the word line connected to the memory cell in question and a separate bias voltage is applied across the memory cell's channel. The gate voltage applied to all other memory cells that are connected to the memory cells that is to be read is such that the other memory cells are fully conducting so that the bias voltage applied along the bitline is applied, to the largest extent possible, across the channel of the memory cell to be read.

Figure 3A:
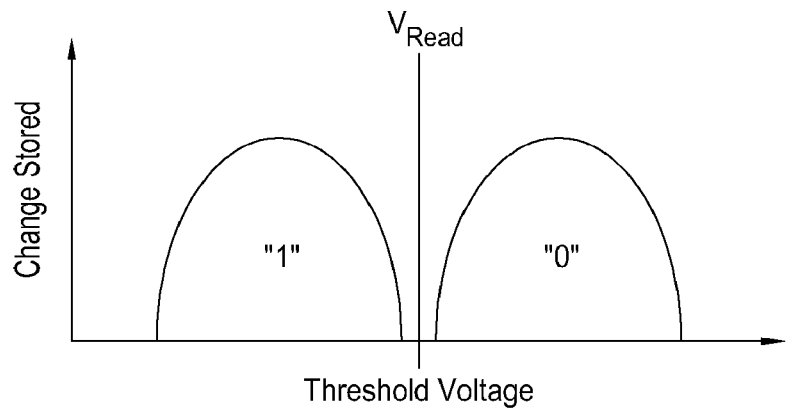
FIG. 3A shows the potential storage states of a memory cell that can store a single bit.

FIG. 3A shows the potential storage states of a memory cell can store a single bit. The abscissa represents the threshold voltage applied to the gate of the memory cell. If a threshold voltage falling between the two storage states (the storage state indicated by "1" is the erased state of the memory cell in may be associated with a logical "1" while the storage state indicated by "0" is the program state of the memory cell in may be associated with a logical "0", although the mapping of storage state to logical information can be reversed) is applied to the gate then the memory cells conducting if the floating gate stores charges falling within the boundary of the "0" storage state and non-conducting if the floating gate stores charges falling within the boundary of the "1" storage state. Thus, by detecting the current flowing memory cell the storage state of the memory cell can be determined. It is to be noted that memory cells that store more than one bit per memory cell are known. Such memory cells require $2^n$ storage distributions (with n being the number of bits stored). The two distributions shown in FIG. 3A are distributions of a plurality of memory cells within the two storage states.

The conductivity of the channel of the memory cell to be read is intended to be influenced solely by the amount of charge stored on the memory cell's floating gate and by the bias voltage (indicated as $V_{Read}$ in FIG. 3A) applied to the gate of the memory cell. The source-drain current that can be sensed as flowing through the channel of/along the bit line connected to the memory cell allows concluding whether the amount of charge stored by the memory cell is above or below an amount required for rendering the channel of the memory cell conductive for a given gate bias voltage. If the flash array is configured to store more than one bit per memory cell, that is if the memory cell has the potential to define more than two memory storage states then a read threshold voltage may have to be applied between every pair of adjacent storage states.

To store charges in the floating gate of a memory cell charges are progressively injected into the floating gate using incremental step pulse program (ISPP). The amount of charge stored on the floating gate is monitored (for example using the above discussed sensing technique) to keep track of programming progress. Once it is determined that a charge that is sufficient to render the memory cell conductive for a given threshold voltage has been stored in a floating gate of the memory cell programming is completed.

It is worth noting that programming is a one-way process in a sense that the amount of charge stored on the floating gate cannot selectively be reduced. Instead, once the amount of charge stored in a memory cell exceeds a desired amount all of the charges on the memory cell need to be removed from the floating gate and programming re-started. Such erasure takes place simultaneously for all memory cells in a block of flash memory.

Figure 3B:
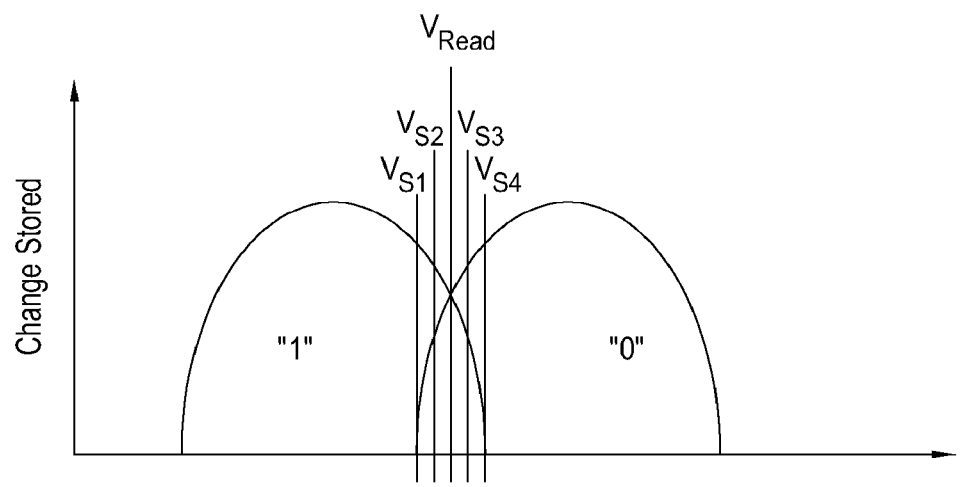
FIG. 3B shows the application of a number of read voltages during reading of a memory cell's storage state.

NAND flash memory cells are subject to various types of impairments that affect its performance, such as inaccurate programming, retention noise, random telegraph noise and more importantly inter-cell interference (ICI). It will be appreciated that charges stored on the floating gate generate electric fields that can influence the conductivity of the channel of an adjacent memory cell, thereby interfering with and potentially falsifying perceived memory cell storage state. This is illustrated in FIG. 3B. It will be appreciated that, even if the threshold voltage $V_{Read}$ is chosen it is still possible for programmed memory cells that happen to fall within the leftmost part of the "0" charge distribution to not be able to cause the memory cell to conduct. These memory cells are then incorrectly interpreted as relating to storage state "1". Conversely it is also possible for an erased memory cells that happen to fall within the rightmost part of the "1" charge distribution to cause the memory cell to conduct during a read operation so that these memory cells are being incorrectly interpreted as relating to storage state "0". As flash memory architectures continue to be miniaturised the effect electric fields have on adjacent cells becomes more pronounced, thereby increasing ICI.

One way of mitigating the increasing ICI effect is to employ soft-decision error correction codes (ECCs). Towards this purpose, a flash memory controller may start by comparing the threshold voltage against the hard decision boundaries. If sensing of the storage states of memory cells using hard decision boundaries soft decoding may instead be used. Error correction codes to which soft decoding can be applied include a LDPC (low-density parity check) code, aBCH code, a turbo code, an RS (Reed-Solomon code), a convolution code, an RSC (Recursive Systematic Code), or coded modulation such as TCM (Trellis-Coded Modulation), BCM (Block Coded Modulation), and so on. Soft deciding algorithms that can be used include, amongst others, mini-sum algorithms and Viterbi decoding. For soft decoders to work in the best possible way they require knowledge of the reliability of (e.g., log-likelihood ratios (LLRs)) of the read information to be fed to the iterative decoder. As the channel model is not precisely known, it is desirable to have a simple and dynamic LLR estimation algorithm instead of relying on precomputed lookup table that may undermine the performance the soft detection method.

Some flash memory arrays may be configured to perform an initial 'hard detection' routine in an attempt to determine the storage states of a group of memory cell by simply distinguishing between the stored states using the above described reading process. Any errors encountered are corrected using error correction codes that have originally been stored with the data that is to be read. In such a hard detection routine the threshold voltage used for distinguishing between two storage states may be changed in subsequent read attempts until a threshold voltage that minimises the total number of errors in the read group of cells is minimised. FIG. 3B illustrates this. In a first read operation threshold voltage $V_{Read}$ shown in FIG. 3B may be used. If the charge distributions of the group of memory cells are as shown in FIG. 3B then the use of this threshold voltage may provide a reading with no or a minimal number of errors. The flash memory may be configured to attempt to perform additional readings of the storage states of the group of memory cells using other threshold voltages that are higher or lower than $V_{Read}$. Such alternative threshold voltages are shown as $V_{S1}$, $V_{S2}$, $V_{S3}$ and $V_{S4}$ in FIG. 3B. The number of errors detected for the group of memory cells using the various read voltages may be compared and the read result that delivers the fewest errors may be chosen for further processing. If the number of errors is low enough to allow the error correction codes stored with the read data to correct these errors then such correction takes place and no further efforts have to be expended on correcting the data.

It will be appreciated that moving the threshold voltage between reads, for example from $V_{Read}$ to $V_{S2}$, the number of memory cells that have been detected as having one of the storage states, say the number of memory cells detected to be in the left-most storage state (mapped to a binary "1" in FIG. 3B) when the threshold voltage $V_{Read}$ is used, is higher than the number of memory cells detected to be in this storage state when threshold voltage $V_{S2}$ is used. Equally, the number of memory cells that have been detected as having the other one of the storage states, in the example the number of memory cells detected to be in the right-most storage state (mapped to a binary "0" in FIG. 3B) when the threshold voltage $V_{Read}$ is used, is lower than the number of memory cells detected to be in this storage state when threshold voltage $V_{S2}$ is used. In the following the intervals defined by respective adjacent threshold voltages are referred to as quantisation intervals r. The total number of quantisation intervals will be referred to as L in the following and has to be larger than $2^n$. Further quantisation intervals are below threshold voltage $V_{S1}$ and above $V_{S4}$, so that L=6 in the embodiment illustrated in FIG. 3B. Whilst the creation of the quantisation intervals has been described as a result of a hard read algorithm it is envisaged that, if desired or required, further read operations using threshold voltage values to create further quantisation intervals are performed in embodiments.

ECC decoder soft input information can be provided in the form of log likelihood ratio (LLR) information. The LLR is defined as $$LLR = \log \frac{Pr(b = 1 \mid y)}{Pr(b = 0 \mid y)},$$

where b is the data bit and y is the received (read) value, so, for a given quantisation interval r, that Pr(b=1|y) is the probability of a data bit that has been stored as b=1 being read as a value y=1 and Pr(b=0|y) is the probability of a data bit that has been stored as b=0 being read as a value y=0. If these conditional probabilities can't be explicitly calculated, a measurement-based technique can be used. As disclosed in, for example, Eran Sharon and Alex Bazarsky (Eran Sharon and Alex Bazarsky, "Dynamic memory error model estimation for real and ECC adaptations", Non-Volatile Memory Workshop, March 2017) it can be shown that the magnitude of the LLR is related to the bit-error rate (BER). In particular for a received value in quantisation interval r, the LLR magnitude is $$|L_r| = \log \frac{1 - P_r}{P_r}$$

where $P_r$ is the BER for that particular interval. It is therefore desirable to estimate the interval-dependent BER $P_r$.

Figure 4:
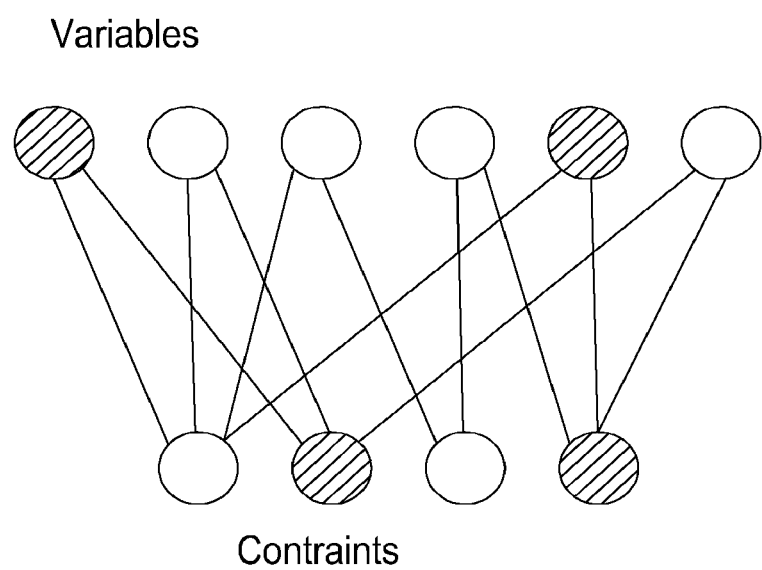
FIG. 4 shows an example LDPC code.

Consider a subsection of a regular LDPC code shown in FIG. 4. The variable nodes shown as the upper row of nodes in FIG. 4 hold the bit information to be corrected/decoded using the LDPC code. The constraint nodes shown as the lower row of nodes in FIG. 4 specify a method of combining the information provided to them by the variable nodes connected to the constraint nodes in the manner shown by the lines of FIG. 4. Let the number of bits received in quantisation interval r that are connected to q unsatisfied constraints be denoted by $C_{r,q}$ and the number of bits received in quantisation interval r by $C_r$. The expected value of the former can be expressed as:

$$E\{C_{r,q}\}=(P_{q|e}P_r+P_{q|c}(1-P_r))C_r=(P_{q|e}-P_{q|c})E_r+P_{q|c}C_r \quad (1)$$

where $E_r$ is the number of bit errors in interval r, $P_{q|e}$ and $P_{q|c}$ are the probabilities that a bit is connected to q unsatisfied constraints given that it is wrong and correct, respectively. Assuming independence of bits connected to the same constraint (which roughly holds for high-girth LDPC codes), these probabilities can be expressed as:

$$P_{q|e} = \binom{d_v}{q} p_{u|e}^q (1-p_{u|e})^{d_v-q} \quad (2)$$

$$P_{q|c} = \binom{d_v}{q} p_{u|c}^q (1-p_{u|c})^{d_v-q} \quad (3)$$

where $p_{u|e}$ and $p_{u|c}$ are the probabilities that a constraint is unsatisfied given that a certain bit is wrong and correct, respectively, and $d_v$ is the variable degree of the LDPC code. These probabilities are founds as:

$$p_{u|e} = \frac{1+(1-2p)^{d_c-1}}{2} \quad (4)$$

$$p_{u|c} = \frac{1-(1-2p)^{d_c-1}}{2} \quad (5)$$

where p is the overall (interval-independent) BER and $d_c$ is the constraint degree of the LDPC code. The overall BER is related to the interval-dependent errors by a simple summation:

$$p = \frac{1}{N}\sum_{r=1}^{L} E_r \quad (6)$$

where N is the total number of bits and L is the number of quantisation intervals. Through the observations $\hat{C}_{r,q}$, $\hat{C}_r$ and the variable dependencies, we have:

$$\hat{C}_{r,q}=(P_{q|e}(E_r)-P_{q|c}(E_r))E_r+P_{q|c}(E_r)\hat{C}_r \quad (7)$$

Determining the errors $E_r$, and hence $$P_r = \frac{E_r}{C_r}$$

is a very complex optimisation task since $E_r$ affects the probabilities $P_{q|e}$, $P_{q|c}$ in a highly non-linear fashion.

In the above calculations, we assumed a regular LDPC code (all variable and constraint nodes have the same degree). If an irregular code is used, the same procedure applies but will then have to be repeated for every type of node degree.

Instead of performing a complicated minimisation, it was found that the errors $E_r$ can be found in a much less computationally complex way. The probability that a constraint is unsatisfied can be computed as:

$$p_c = p_{u|e} p + p_{u|c}(1-p) \quad (8)$$

$$= \frac{1+(1-2p)^{d_c-1}}{2} p + \frac{1-(1-2p)^{d_c-1}}{2}(1-p)$$

$$= \frac{1+(1-2p)^{d_c}}{2}$$

$$\Rightarrow p = \frac{1+(1-2p_c)^{1/d_c}}{2}$$

where p is the overall bit error probability. Hence the overall BER can be found directly and the intermediate probabilities $p_{u|e}$, $p_{u|c}$, $P_{q|e}$, $P_{q|c}$ can be computed. The errors $E_r$ are then computed using:

$$\hat{C}_{r,q}=(P_{q|e}-P_{q|c})E_r+P_{q|c}\hat{C}_r \quad (9)$$

A weighted least-squares (WLS) metric is, in one embodiment, used to reflect the fact that there can be significant differences in the number of bits and unsatisfied constraints, $\hat{C}_{r,q}$, which means that errors should have different importance. The WLS problem:

$$\hat{E}_r = \underset{E_r}{\operatorname{argmin}} \sum_{q=0}^{d_v} \hat{C}_{r,q}\left(\hat{C}_{r,q} - (P_{q|e} - P_{q|c})E_r - P_{q|c}\hat{C}_r\right)^2 \quad (10)$$

is solved as:

$$\hat{E}_r = \frac{\sum_{q=0}^{d_v} \hat{C}_{r,q}(P_{q|e} - P_{q|c})(\hat{C}_{r,q} - P_{q|c}\hat{C}_r)}{\sum_{q=0}^{d_v} \hat{C}_{r,q}(P_{q|e} - P_{q|c})^2} \quad (11)$$

This does not involve any numerical optimisations or complex minimisations.

Figure 5:
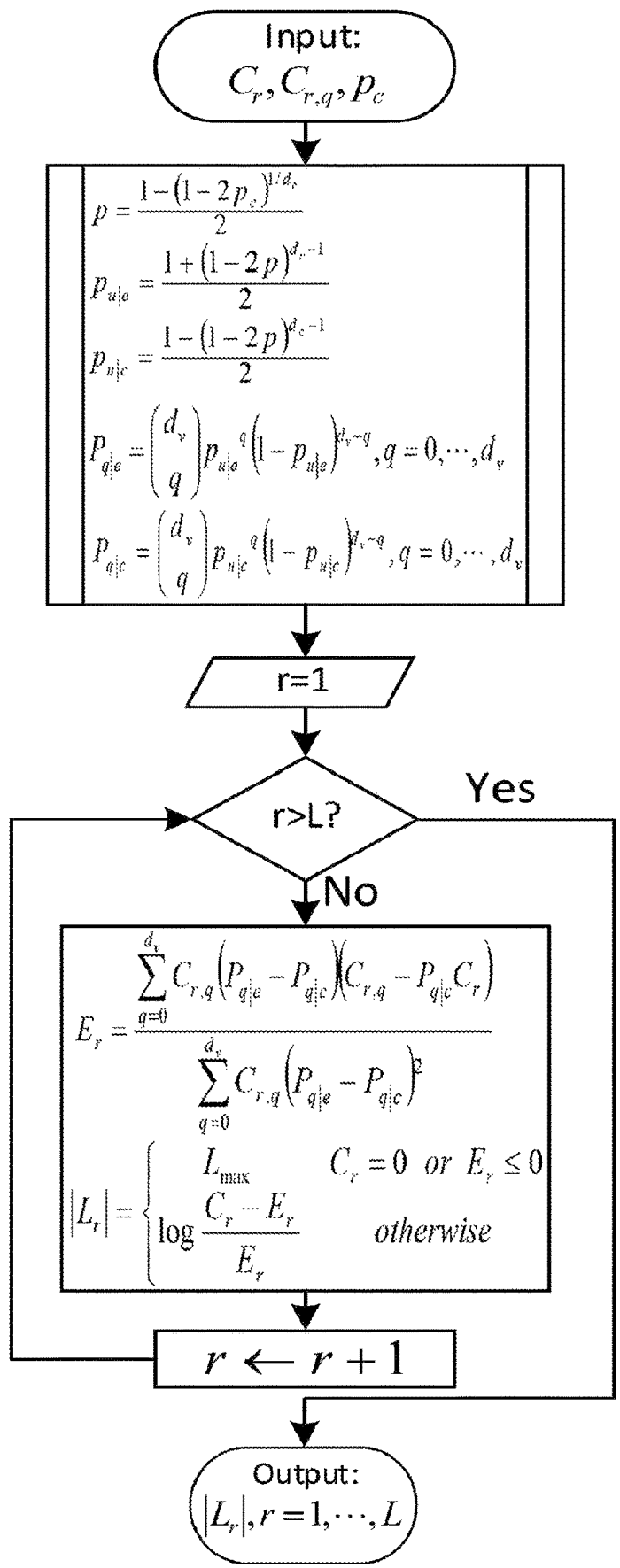
FIG. 5 is a flow chart showing an algorithm of an embodiment.

The complete algorithm is shown in the flow chart in FIG. 5. The method receives as input $C_r$ (the number of bits in quantisation interval r), $C_{r,q}$ (the number of bits received in quantisation interval r that are connected to q unsatisfied constraints) and $p_c$ (the probability that a constraint of the LDPC code is unsatisfied, as indicated by the read values and the parity check matrix).

In the subsequent step the probability p that any of the constraints of the LDPC is unsatisfied is calculated using equation (8) above. On the basis of this calculation $P_{u|e}$, $p_{u|c}$ (the probabilities that a constraint is unsatisfied given that a certain bit is wrong and correct, respectively), $P_{q|e}$ and $P_{q|c}$ (the probabilities that a bit is connected to q unsatisfied constraint given that it is wrong and correct, respectively) are calculated using equations (2) to (5) above.

After initialising index r to a starting value of 1 a processing loop is entered in which the errors $E_r$ are calculated in consecutive iterations of the loop using equation (11) above until the quantisation index r (which is incremented in each iteration of the loop) would exceed the total number of quantisation intervals to be considered (r>L?) if the iterations were continued. In each iteration of the loop the LLR magnitude for the currently considered quantisation interval is also calculated using:

$$|L_r| = \begin{cases} L_{max} & C_r = 0 \text{ or } E_r \leq 0 \\ \log\dfrac{C_r - E_r}{E_r} & \text{otherwise} \end{cases} \quad (12)$$

This equation includes two fail-safe provisions in that a predetermined value $L_{max}$ is chosen if the results for the calculation of $E_r$ erroneously suggests that the error is equal to or smaller than zero ($E_r \leq 0$) or if $C_r = 0$ (no bits were recorded in an interval). The choice of $L_{max}$ may be based on simulations or experience values.

The final LLR for the quantisation interval r is then calculated as $L_r = (2\hat{b}-1)|L_r|$ where $\hat{b}$ is the hard decision on the bit.

The advantage of the embodiment compared to existing methods is that the complexity is significantly reduced. Instead of solving a complex optimisation problem, the embodiment determines intermediate variables directly, thereby avoid costly minimisation steps.

In the following the above discussed LLR technique is extended to multicell write-once memory (WOM) codes that are used in flash memory.

Figure 6:
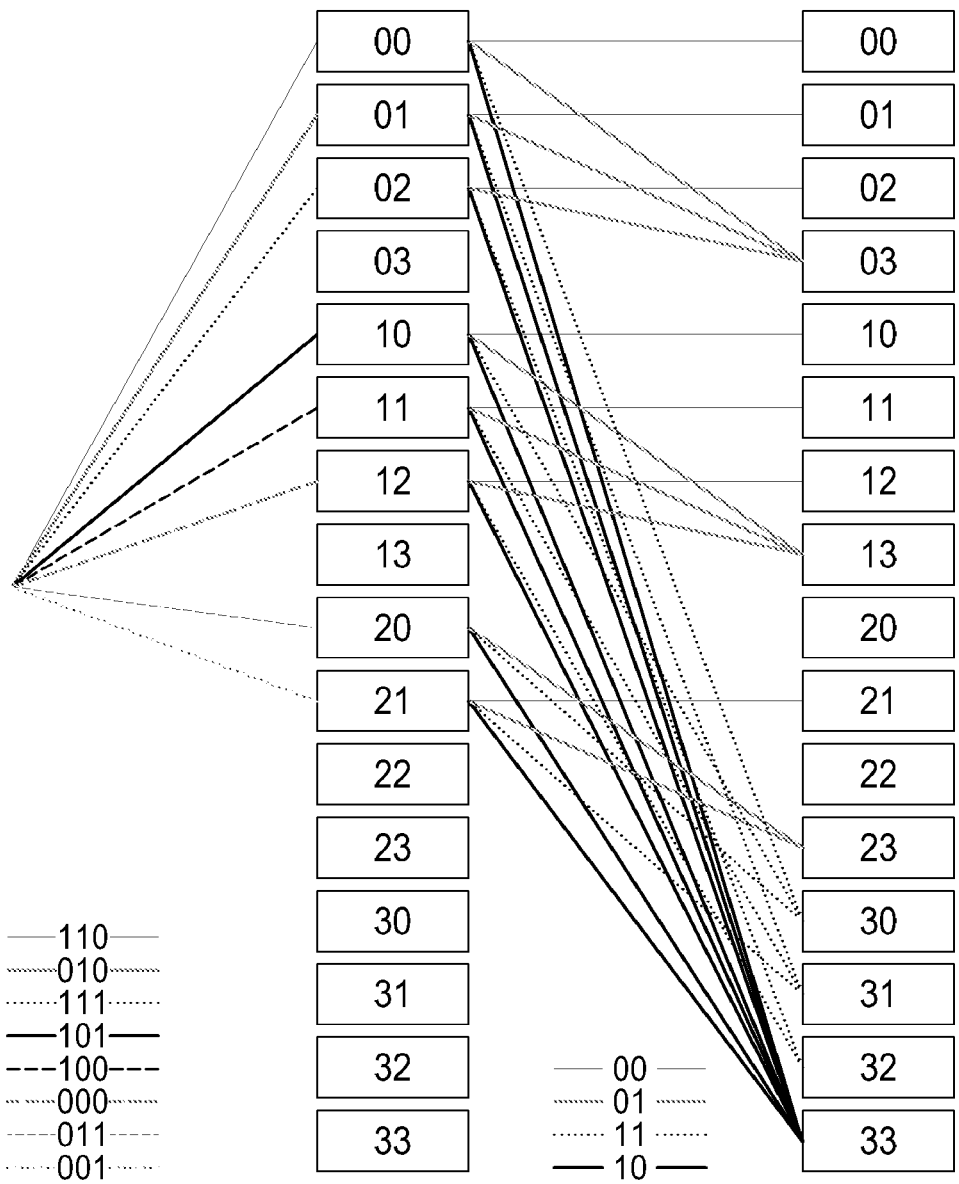
FIG. 6 shows a WOM code for flash memory.

The level of charges stored in flash memory cells can be increased in well-defined ways but a corresponding partial decrease of the stored charges is not possible. Instead during operation the charges in the memory cells are gradually increased until a desired charge amount is reached. If a smaller charge amount is to be stored then all of the charges stored in the cells need to be removed from the cell and the charge amount be increased thereafter until the desired charging state is reached. Charge storage and erasure cycles reduce the lifetime of the memory. To counteract this cell deterioration WOM codes have been designed that allows for multiple writes before the cells need to be erased. One such code for cells configured to store up to data in two memory cells in two write operations is shown in FIG. 6. In the left-hand column of FIG. 6 the storage state of the two memory cell after a first write operation is shown. Each of the two memory cells can adopt four different storage states, storage states 0 to 3. To the left of the left-hand column the three bit information stored in the two memory cells in the first write operation is shown.

The lines connecting the storage states illustrated in the left-hand column of FIG. 3 with the storage states illustrated in the right-hand column relate to the two bit information stored in a second programming operation. These transitions either increase the level of charge stored in the memory cells or keep it constant, should the information to be stored in the second programming operation require this. No reduction in the amount of stored charge takes place during the second programming step.

Since this WOM covers two cells, a two-dimensional LLR look-up table is used in the embodiment. Instead of determining $L_r$, as described above, the embodiment determines $L_{r_1,r_2}$ where $r_1$ and $r_2$ indicate the quantisation intervals for the two cells. Apart for this, the algorithm is the same as before.

Figure 7:
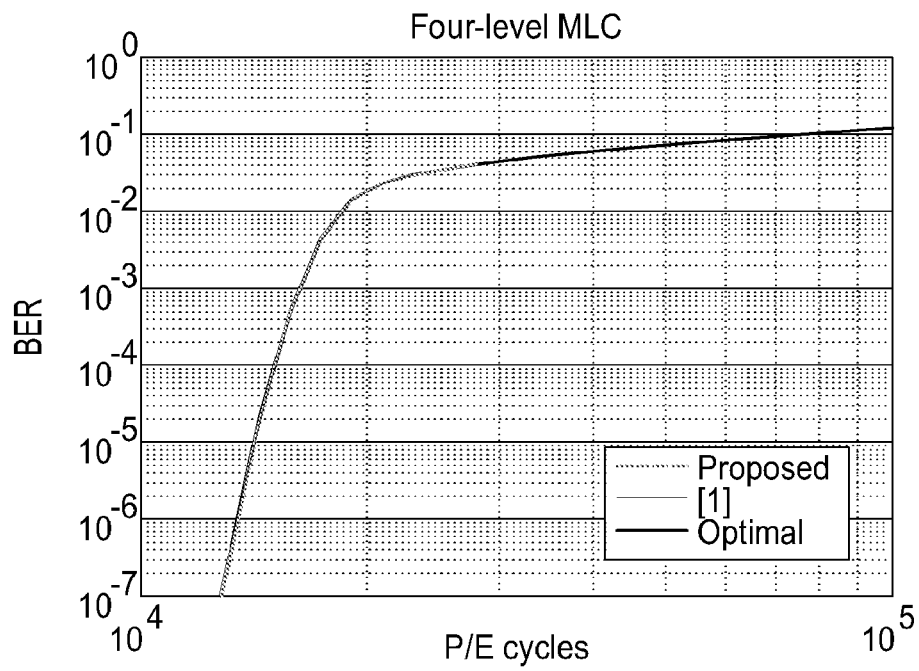
FIG. 7 shows a Performance for MLC flash memory.
Figure 8:
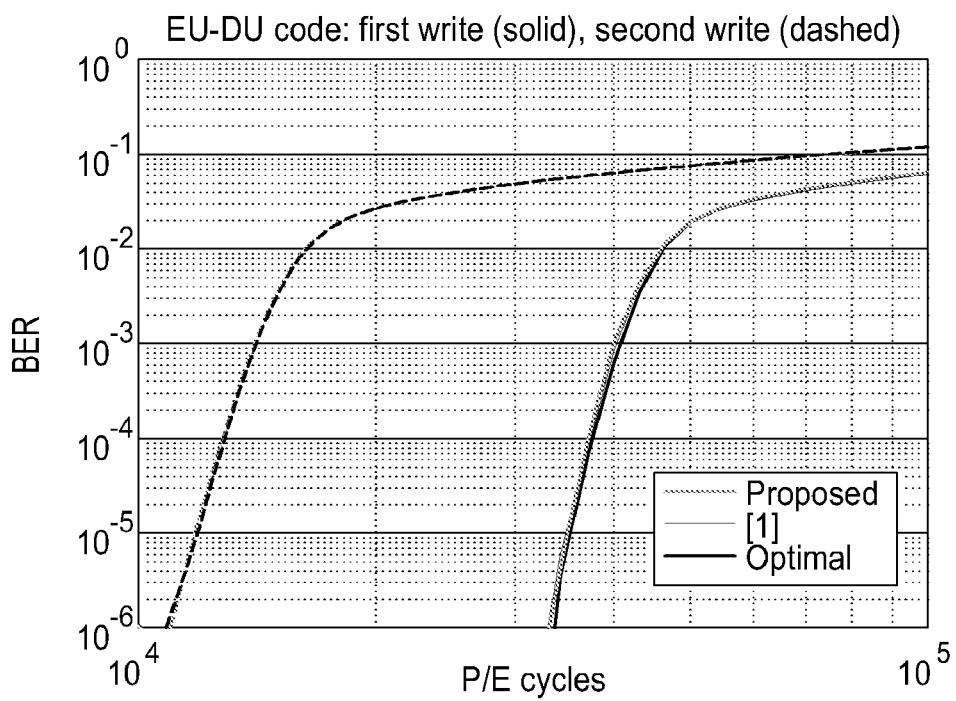
FIG. 8 shows a Performance of the WOM code.

To illustrate the performance of the LLR generation, a flash memory with multilevel cells (MLC) with four storage states (i.e. two bits per cell) and impaired by intercell interference, random telegraph noise (modelled as Laplacian noise, with the variance being a function of the number of P/E cycles) and retention impairment (modelled as Gaussian noise, with the variance also being a function of the number of P/E cycles) was simulated. As each memory cell stores two bits of information the method illustrated in FIG. 5 was performed for each of the two bits, generating two separate LLR tables. A (9825,7860) regular LDPC code with variable degree $d_v = 3$ and constraint degree $d_c = 15$ was used. As a comparison, the LLRs generated by Eran Sharon, Alex Bazarsky, "Dynamic memory error model estimation for real and ECC adaptations", Non-Volatile Memory Workshop, March 2017 with the MSE metric and optimal LLRs, based on offline simulations were used. As can be seen from FIG. 7, the bit error rate performance of the above discussed method of embodiments is virtually indistinguishable from theoretically achievable optimal performance and from the performance of the Sharon et. al. method, whilst being considerably less computationally demanding. Increasing noise is present with increasing program/erase (P/E) cycle count. This increases BER.

Figure 9:
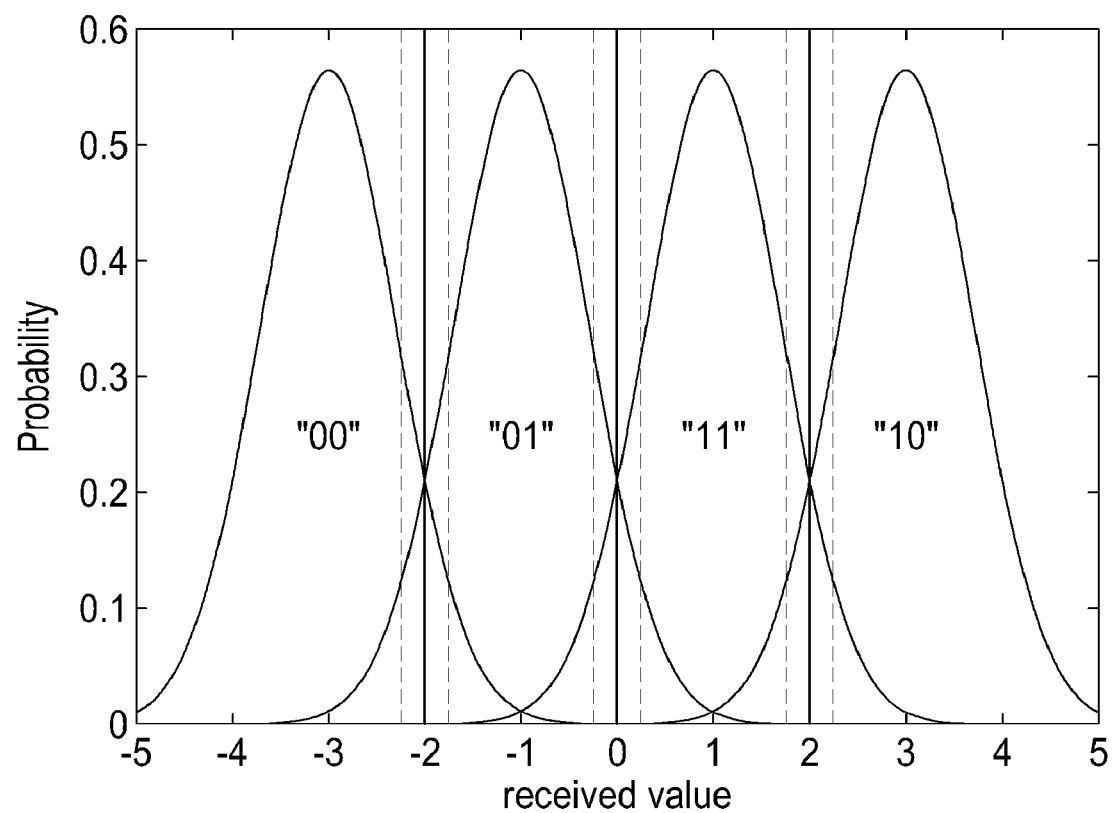
FIG. 9 shows possible distributions of receive signals of four pulse amplitude modulated signal values.

FIG. 9 shows the distributions of four signals received in a wireless amplitude modulated signal transmission method. As can be seen from FIG. 9, the signal distributions overlap in the same manner as discussed above with reference to data read from flash memory. The signal values received are floating point values that can be compared to the "hard decision" boundaries shown in solid lines between the signal distributions in FIG. 9. One or more soft decision boundaries (shown in dashed lines in FIG. 9) are further defined on either side of one or more of the hard decision boundaries, similar to the threshold values $V_{S1}$ to $V_{S4}$ shown in FIG. 3B, and the received floating point values are compared to these boundaries. The log likelihood values can then be calculated in the same manner as discussed above.

The commonly used QAM (Quadrature Amplitude Modulation) uses to separate pulse amplitude modulated symbols that can be decoded independently from each other in the above described manner.

Whilst certain embodiments have been described, these embodiments have been presented by way of example only, and are not intended to limit the scope of the inventions. Indeed, the novel devices, and methods described herein may be embodied in a variety of other forms; furthermore, various omissions, substitutions and changes in the form of the devices, methods and products described herein may be made without departing from the spirit of the inventions. The accompanying claims and their equivalents are intended to cover such forms or modifications as would fall within the scope and spirit of the inventions.

The invention claimed is:

1. A method of soft decoding received signals, the method comprising:
    defining quantisation intervals for a signal value range;
    determining a number of bits detected in each quantisation interval, a number of bits in each quantisation interval that are connected to unsatisfied constraints and a probability that an error correction code is unsatisfied;
    determining an overall bit error rate based on the probability that the error correction code is unsatisfied;
    determining a log likelihood ratio for each quantisation interval based on the overall bit error rate, the number of bits detected in each quantisation interval and the number of bits in each quantisation interval that are connected to unsatisfied constraints; and
    performing soft decoding using the log likelihood ratios.

2. The method of claim 1, further comprising:
    determining an error in each quantisation interval based on the overall bit error rate and the number of bits in each quantisation interval that are connected to unsatisfied constraints; and thereafter determining said log likelihood ratio further using said overall bit error rate.

3. The method of claim 1, further comprising:
determining one or more or all of:
- a probability that a constraint is unsatisfied when an associated bit is correct based on said overall bit error rate and a constraint degree of the error correction code;
- a probability that a constraint is unsatisfied when an associated bit is incorrect based on said overall bit error rate and a constraint degree of the error correction code;
- a probability that a correct bit is connected to a predetermined number of unsatisfied constraints based on a variable degree of the error correction code, the number of unsatisfied constraints and a probability that a constraint is unsatisfied when an associated bit is correct; and
- a probability that an incorrect bit is connected to a number of unsatisfied constraints based on a variable degree of the error correction code, the number of unsatisfied constraints and a probability that a constraint is unsatisfied when an associated bit is incorrect.

4. The method of claim 1, further comprising setting said log likelihood ratio to a predetermined value for a or any quantisation interval in which one or more of the number of bits detected is zero or in which an error is determined to be lower or equal to zero.

5. The method of claim 1, wherein data is stored using a multicell write once storage technique, wherein said log likelihood ratios are determined for an array, wherein the quantisation intervals for individual cells used in combination in the multicell write once storage technique individually define dimensions of the array.

6. The method of claim 1, further comprising a step of attempting to hard decode data by repeatedly reading memory cells storing said data with a changing read threshold parameter, said quantisation intervals being defined by said change in the read threshold parameter.

7. The method of claim 1, further comprising outputting soft decoded data from a controller that has performed said soft decoding to an output port or to a connected device.

8. A non-transitory storage medium storing computer program instructions for execution by a processor and that, when executed by a processor, cause the processor to perform the method of claim 1.

9. A device for soft decoding received signals comprising a processor and memory storing instructions for execution by the processor, the instruction causing the processor when executing the instruction to:
- define quantisation intervals for a signal value range;
- determine a number of bits detected in each quantisation interval, a number of bits in each quantisation interval that are connected to unsatisfied constraints and a probability that an error correction code is unsatisfied;
- determine an overall bit error rate based on the probability that the error correction code is unsatisfied;
- determine a log likelihood ratio for each quantisation interval based on the overall bit error rate, the number of bits detected in each quantisation interval and the number of bits in each quantisation interval that are connected to unsatisfied constraints; and
- perform soft decoding using the log likelihood ratios.

10. The device of claim 9, the instruction causing the processor when executing the instruction to:
- determine an error in each quantisation interval based on the overall bit error rate and the number of bits in each quantisation interval that are connected to unsatisfied constraints; and
- thereafter determine said log likelihood ratio further using said overall bit error rate.

11. The device of claim 9, the instruction causing the processor when executing the instruction to:
determine one or more or all of:
- a probability that a constraint is unsatisfied when an associated bit is correct based on said overall bit error rate and a constraint degree of the error correction code;
- a probability that a constraint is unsatisfied when an associated bit is incorrect based on said overall bit error rate and a constraint degree of the error correction code;
- a probability that a correct bit is connected to a predetermined number of unsatisfied constraints based on a variable degree of the error correction code, the number of unsatisfied constraints and a probability that a constraint is unsatisfied when an associated bit is correct; and
- a probability that an incorrect bit is connected to a number of unsatisfied constraints based on a variable degree of the error correction code, the number of unsatisfied constraints and a probability that a constraint is unsatisfied when an associated bit is incorrect.

12. The device of claim 9, the instruction causing the processor when executing the instruction to set said log likelihood ratio to a predetermined value for a or any quantisation interval in which one or more of the number of bits detected is zero or in which an error is determined to be lower or equal to zero.

13. The device of claim 9, wherein data is stored using a multicell write once storage technique, wherein said log likelihood ratios are determined for an array, wherein the quantisation intervals for individual cells used in combination in the multicell write once storage technique individually define dimensions of the array.

14. The device of claim 9, the instruction causing the processor when executing the instruction to perform a step of attempting to hard decode data by repeatedly reading memory cells storing said data with a changing read threshold parameter, said quantisation intervals being defined by said change in the read threshold parameter.

15. The device of claim 9, the instruction causing the processor when executing the instruction to output soft decoded data from a controller that has performed said soft decoding to an output port or to a connected device.

16. The device of claim 9, wherein the device is a flash memory storage device.

17. The device of claim 9, wherein the device is a wireless communications device.

* * * * *